ALUMINUM-GOLD CONTACT TO SILICON AND GERMANIUM
Filed Oct. 3, 1966
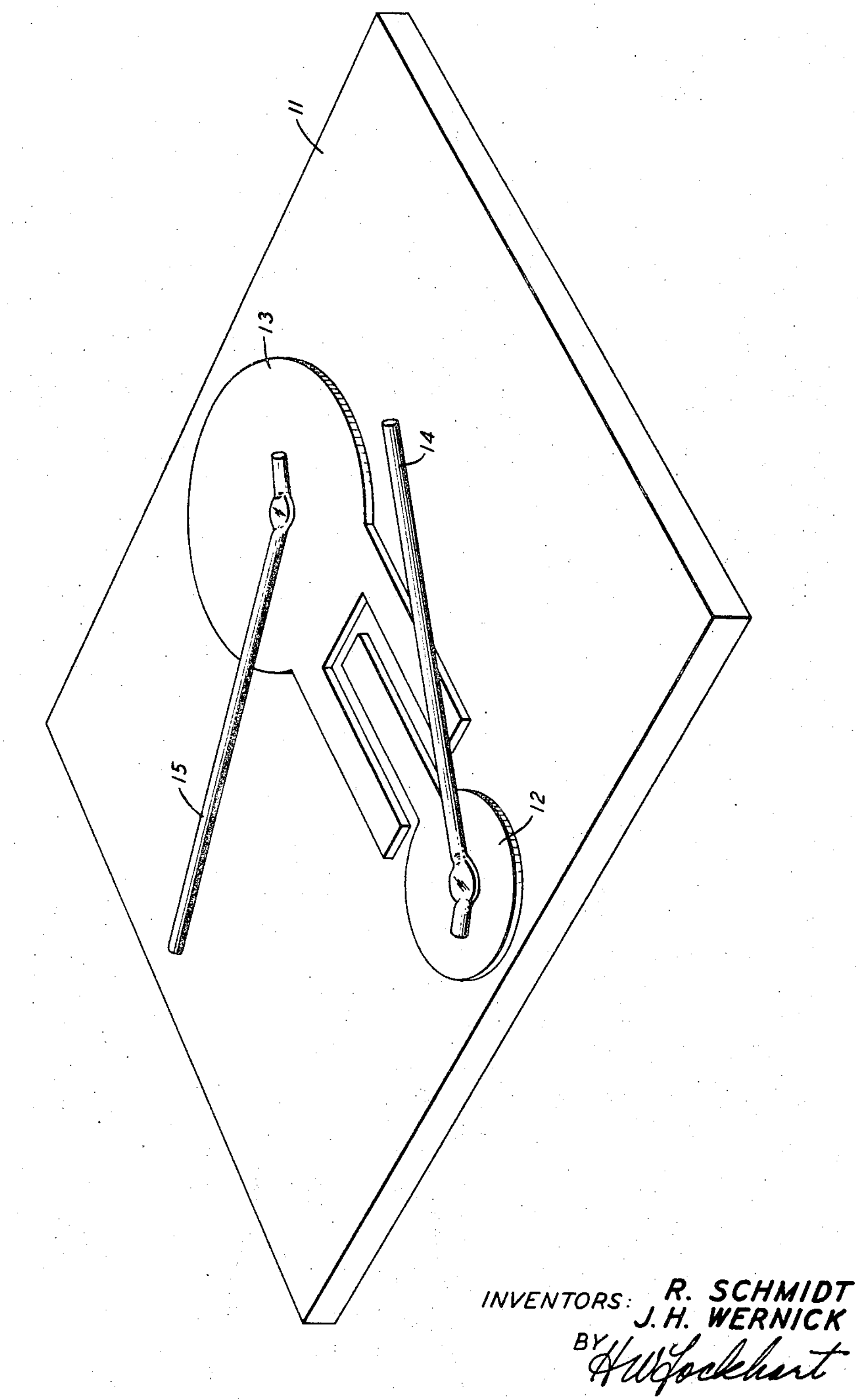
INVENTORS: R. SCHMIDT
J. H. WERNICK
BY H. W. Lockhart
ATTORNEY United States Patent Office 3,403,308

Patented Sept. 24, 1968

3,403,308

ALUMINUM-GOLD CONTACT TO SILICON AND GERMANIUM

Rudolf Schmidt, Summit, and Jack H. Wernick, Madison, N.J., assignors to Bell Telephone Laboratories, Incorporated, Murray Hill, N.J., a corporation of New Jersey Filed Oct. 3, 1966, Ser. No. 583,691

8 Claims. (Cl. 317—234)

This invention relates to semiconductor devices and more particularly to connections to semiconductor devices.

A highly advantageous arrangement for making electric connection to semiconductor devices, chiefly of silicon semiconductor material but also germanium, involves the use of aluminum areas on the semiconductor and gold wires bonded to the aluminum areas. However, the gold-aluminum system suffers from one drawback in that the bonds between the two metals deteriorate with time, particularly at elevated temperatures. The malady has been variously referred to as "plague formation" and numerous solutions to the problem have been suggested. For example, Patent 3,239,376 to R. Schmidt proposes a technique for avoiding certain problems in connection with the gold-aluminum system.

It has now been determined that a chief reason for the deterioration of the bonds between gold wire leads and aluminum surfaces arises from the rapid migration of gold from the gold-alloy interface into the aluminum substrate. Further deterioration may also result from the formation of gold-aluminum intermetallic compounds although this latter cause occurs usually with larger area bonds.

In accordance with this invention certain metallurgical arrangements have been discovered which almost completely inhibit the deterioration of gold-aluminum bonds of the type described above. In particular it has been found that the addition of a small concentration, within a particular range, of phosphorus is of primary significance in improving gold-aluminum bonded connections. Further deterioration is inhibited additionally by eliminating, to the greatest extent possible, certain other metals which may occur as undesired impurities in very small amounts.

The invention may be better understood from the following more detailed explanation taken in connection with the drawing which shows in simplified perspective a semiconductor wafer having bonded wire leads to electrodes thereon.

The drawing shows a wafer 11 of silicon semiconductor material suitable for making of a silicon transistor. On the surface of the wafer 11 is a first smaller electrode 12 forming the emitter connection and a larger metal electrode 13 forming the base connection. The electrodes 12 and 13 are formed bv techniques well known in the art, usually consisting of vacuum evaporation through masks or upon suitably masked surfaces on the semiconductor. Low resistance contact between electrodes 12 and 13 and the semiconductor material is in the region of the interdigitated portions of the electrodes which usually are lightly alloyed into previously diffused zones of the underlying semiconductor material.

The means for making external connection to the emitter and base electrodes comprises the gold wire leads 14 and 15 which are attached to the aluminum electrodes 12 and 13 by thermocompression bonding. This technique is well known and widely practiced and is disclosed in Patent 3,006,067 to O. L. Anderson and H. Christensen. The foregoing described structures and methods are well known in the art and constitute standard procedures for fabricating a semiconductor device.

However the gold wire aluminum electrode combination presents a system in which practically any temperature in excess of room temperature, causes the migration of gold from the lead wires 14 and 15 into the adjoining aluminum electrodes. As a consequence there is a reduction in the cross section of the lead wire particularly in the portion close to the bonded area which results ultimately in the parting of the wire from its bonded portion. This result is avoided in accordance with this invention by providing in the metallurgical arrangement of the bond an amount of phosphorus in the range of from a few parts per million to about one-tenth of a percent.

Quantities in excess of this upper limit should be avoided inasmuch as excessive amounts of phosphorus may migrate from the contact into the semiconductor and alter the electrical characteristics of the semiconductor region. Moreover, if the phophorus is supplied in the gold wire, concentrations much in excess of one-tenth of one percent result in embrittlement of the gold with a consequent loss of desired mechanical properties. Accordingly, phosphorus in the specific concentration range may be supplied either as a part of the deposited aluminum electrode or alloyed with the gold of the lead wires.

In addition to the inclusion of phosphorus to enhance the gold-aluminum contact arrangement it has been found desirable to ensure the absence from the contact materials, to the greatest extent possible, of silver, rhenium, zinc, cadmium, magnesium and arsenic. Further improvement in the reliability of such bonds is observed if the presence of vanadium, copper, tin and indium is avoided. Accordingly, a metallurgical system is disclosed for improved gold-aluminum bonded connections to semiconductor devices by the addition to the connections, of phosphorus at concentration levels of from $1\times10^{-6}$ to about one-tenth of one percent, and further by the avoidance of certain deleterious metals set forth above, particularly in concentrations larger than a few parts per million.

What is claimed is:

1. An aluminum-gold contact to a semiconductor body selected from the group consisting of silicon and germanium which includes phosphorus at a concentration of between about a few parts per million and about 0.1 percent.

2. An aluminum-gold contact in accordance with claim 1 which is substantially free of silver, rhenium, zinc, cadmium, magnesium and arsenic.

3. An aluminum-gold contact in accordance with claim 2 which is substantially free of vanadium, copper, tin and indium.

4. An electrical contact to a semiconductor body comprising an aluminum plated area on the surface of said body and a gold member bonded to said aluminum portion, and a quantity of phosphorus in a total concentration of from about a few parts per million to one-tenth of one percent by weight in at least one of said aluminum and gold contact members.

5. An electrical contact in accordance with claim 4 in which said phosphorus is alloyed in said gold member.

6. An electrical contact in accordance with claim 4 in which said phosphorus is alloyed in said aluminum member.

7. A semiconductor device including a semiconductor body having a plurality of differing conductivity type zones, at least one of said zones having a contact thereto in accordance with claim 1.

8. A semiconductor device comprising a semiconductor body having an aluminum plated area on the surface of said body and a gold member bonded to said aluminum portion, and a quantity of phosphorus in a total concentration of from about a few parts per million to one-tenth of one percent by weight in at least one of said aluminum and gold contact members.

References Cited

UNITED STATES PATENTS

| | | | |
|---|---|---|---|
| 3,239,376 | 3/1966 | Schmidt | 117—212 |
| 3,241,011 | 3/1966 | De Mille et al. | 317—234 |
| 3,271,635 | 9/1966 | Wagner | 317—234 |

FOREIGN PATENTS

| | | |
|---|---|---|
| 903,259 | 8/1962 | Great Britain. |

JOHN W. HUCKERT, *Primary Examiner.*

J. R. SHEWMAKER, *Assistant Examiner.*